(12) United States Patent
Motoori (10) Patent No.: US 6,414,857 B2
(45) Date of Patent: Jul. 2, 2002

(54) PULSE WIDTH MODULATED CONTROL APPARATUS AND METHOD OF USING THE SAME

(75) Inventor: Ryuzo Motoori, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/758,271

(22) Filed: Jan. 12, 2001

(30) Foreign Application Priority Data

Jan. 14, 2000 (JP) ........................................ 2000-005323

(51) Int. Cl.[7] ................................................ H02M 1/12
(52) U.S. Cl. ........................................... 363/41; 318/811
(58) Field of Search ............................. 363/41; 318/811

(56) References Cited

U.S. PATENT DOCUMENTS

| | | | | |
|---|---|---|---|---|
| 4,364,109 A | * | 12/1982 | Okado et al. ................. | 363/41 |
| 4,445,167 A | * | 4/1984 | Okado ........................... | 363/56 |
| 6,013,969 A | * | 1/2000 | Noma et al. .................. | 310/318 |
| 6,091,216 A | * | 7/2000 | Takahashi et al. ........... | 318/254 |
| 6,101,112 A | * | 8/2000 | Suzuki et al. ................. | 363/98 |

* cited by examiner

Primary Examiner—Adolf Deneke Berhane
(74) Attorney, Agent, or Firm—Morgan, Lewis & Bockius LLP (57) ABSTRACT

The present invention provides a PWM control apparatus which makes it possible to obtain a high-precision, high-S/N-ratio, low-cost, small-volume, light-weight motor driving apparatus. In particular, to provide a motor driving apparatus using this PWM control apparatus, a stage apparatus using this motor driving apparatus, an exposure apparatus using this stage apparatus, a device manufactured by means of the exposure apparatus, and a device manufacturing method.

14 Claims, 8 Drawing Sheets

PULSE WIDTH MODULATED CONTROL APPARATUS AND METHOD OF USING THE SAME

This application claims the benefit of Japanese Application No. 2000-005323, filed in Japan on Jan. 14, 2000, which is hereby incorporated by reference.

BACKGROUND OF THE INVENTION

1. Field of the Invention

The present invention relates to a pulse-width-modulated (PWM) control apparatus, a motor driving apparatus, a stage apparatus, an exposure apparatus, a device that is manufactured by means of this exposure apparatus, and a device manufacturing method.

2. Description of the Background Art

A semiconductor exposure apparatus is constructed from a reticle stage that carries a reticle (or mask), a wafer stage that carries a wafer, and a projection optical system that projects a pattern formed on the reticle onto the wafer and exposes this pattern. The respective stages are appropriately driven by motors and motor driving apparatuses that drive these motors, so that the pattern formed on the reticle is accurately projected and exposed in a specified position on the wafer. Linear motors are used as the motors that drive the respective stages, and high-efficiency pulse-width-modulated (PWM) amplifier circuits are used as the circuits that drive these linear motors. Since it is necessary that the stage of the projection exposure apparatus be driven with a high degree of precision, performance that offers high precision and a high S/N ratio is required in this PWM amplifier circuit. Accordingly, a switching regulator, etc., which allows sufficient regulation is used in the power supply.

However, large-capacity switching regulators are expensive, and have a large volume and weight, so that a large proportion of the volume and weight of the semiconductor exposure apparatus is occupied by such a switching regulator. On the other hand, in cases where a simple transformer-less power supply is used, high-frequency components of the power supply frequency remain in the output of the amplifier circuit, so that there is a problem in that performance that offers high precision and a high S/N ratio cannot be guaranteed.

SUMMARY OF THE INVENTION

The present invention provides a PWM control apparatus which makes it possible to to realize a motor driving apparatus that has high precision, a high S/N ratio, low cost, a small volume and a low weight.

A motor driving apparatus of the present invention includes a PWM control apparatus, a stage apparatus that uses this motor driving apparatus, an exposure apparatus that uses this stage apparatus, a device that is manufactured by means of this exposure apparatus, and a device manufacturing method.

A PWM control apparatus of the present invention includes a triangular wave generating circuit for generating a triangular wave, a comparator for comparing an input signal and the triangular wave and outputting a PWM signal with a pulse width corresponding to a voltage level of the input signal switching elements connected to a power supply, and for switching a voltage from this power supply on and off and output a voltage based upon the PWM signal, and an adjustment circuit for adjusting a duty ratio of the PWM signal according to fluctuations in the voltage of the power supply.

The adjustment circuit of the present invention divides the voltage of the input signal by the voltage of the power supply.

The adjustment circuit includes a circuit that adjusts the amplitude of the triangular wave according to fluctuations in the voltage of the power supply.

The adjustment circuit multiplies a triangular wave output from the triangular wave generating circuit by the voltage of the power supply.

The adjustment circuit adjusts a voltage level of a triangular wave generating circuit power supply that supplies power to the triangular wave generating circuit in proportion to fluctuations of the voltage of the power supply.

The triangular wave generating circuit of the present invention includes switching circuits that alternately switch between two different signal levels at specified frequencies, and integrating circuits that integrate outputs of the switching circuits and output a triangular wave, and the adjustment circuit includes an amplifier circuit that outputs the two different signal levels where a signal level difference of the two signal levels varies in proportion to fluctuations of the voltage of the power supply.

A PWM control apparatus of the present invention includes a triangular wave generating circuit for generating a triangular wave, a comparator for comparing an input signal and the triangular wave and outputting a PWM signal with a pulse width corresponding to a voltage level of the input signal, switching elements connected to a power supply for switching a voltage from power supply on and off and outputting a voltage based upon the PWM signal, and an adjustment circuit for adjusting the voltage level of the input signal that is input into the comparator according to a variation of the voltage of the power supply.

A PWM control apparatus of the present invention includes a triangular wave generating circuit for generating a triangular wave, a comparator for comparing an input signal and the triangular wave and outputting a PWM signal with a pulse width corresponding to a voltage level of the input signal, switching elements connected to a power supply for switching a voltage from the power supply on and off and outputting a voltage based upon the PWM signal, and an adjustment circuit for adjusting an amplitude of the triangular wave according to a variation of the voltage of the power supply.

A motor driving apparatus of the present invention comprises a current amplifier circuit which includes a PWM control apparatus of the present invention.

A stage apparatus of the present invention comprises a stage that carries an object of movement, a motor that drives the stage to move the object of movement, and a motor driving apparatus of the present invention which drives the motor.

An exposure apparatus of the present invention forms a specified pattern on a substrate by means of exposure, and is equipped with at least a stage apparatus of the present invention which carries and moves either a mask or a substrate.

A device of the present invention which is manufactured by means of an exposure apparatus of the present invention.

A device of the present invention which is manufactured by using an exposure apparatus of the present invention and comprises a process in which the exposure is performed by means of the exposure apparatus of the present invention.

A PWM control method of the present invention in which the voltage from a power supply is switched on and off and output on the basis of a PWM signal having a pulse width that corresponds to a voltage level of an input signal, and is devised so that a duty ratio (degree of modulation) of the PWM signal is adjusted based upon fluctuations in a voltage level of the power supply.

DETAILED DESCRIPTION OF THE PREFERRED EMBODIMENT

Reference will now be made in detail to the preferred embodiments of the present invention, examples of which are illustrated in the accompanying drawings.

First, a projection exposure apparatus in which stages are driven by a motor driving apparatus using a PWM control apparatus (PWM circuit) of the present invention will be described.

Figure 1:
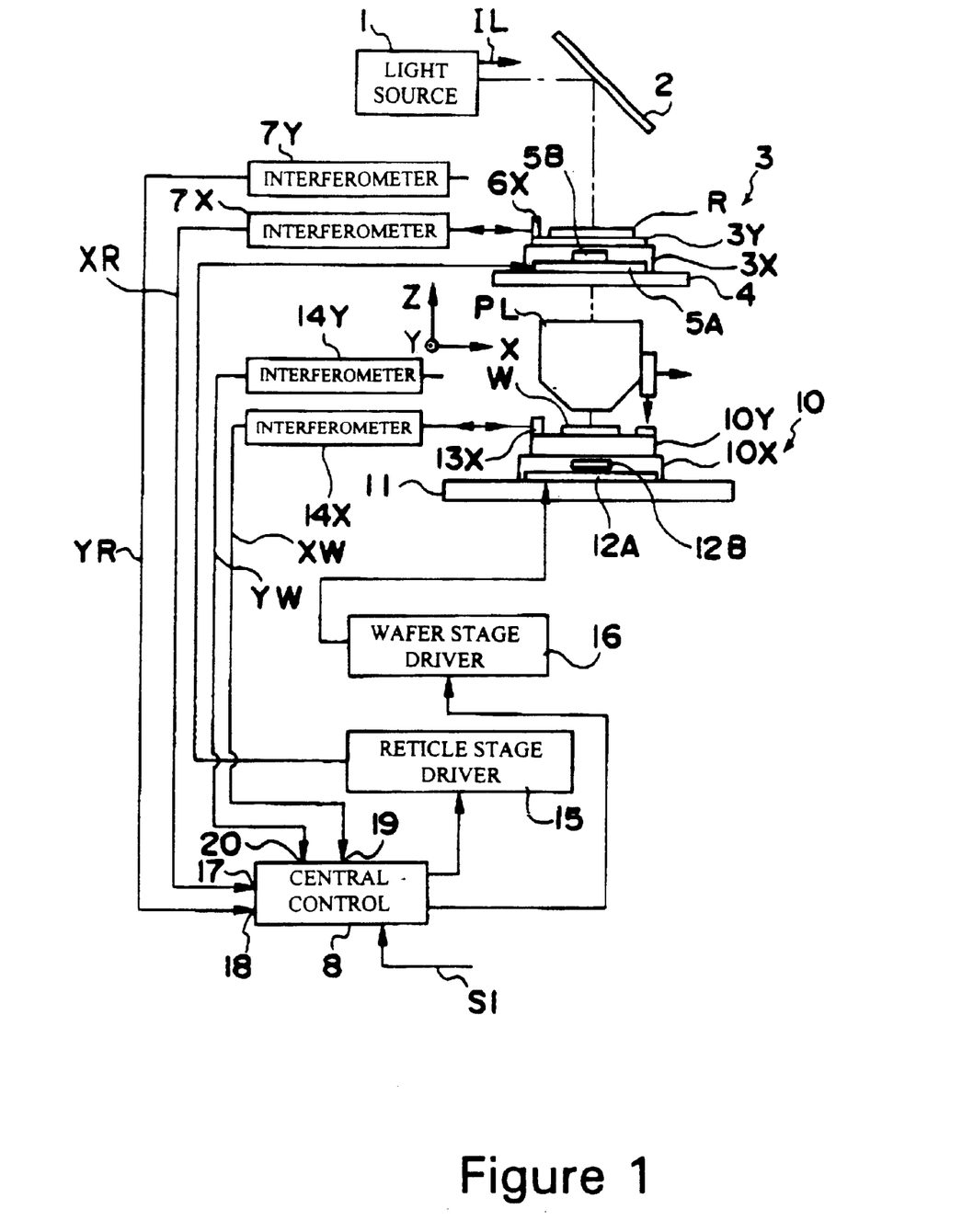
FIG. 1 shows a schematic construction of a projection exposure apparatus of the present invention.

FIG. 1 shows a schematic construction of the projection exposure apparatus of the present invention. This projection exposure apparatus is a stepper type (step-and-repeat type) projection exposure apparatus which exposes a reduced image of the pattern of a reticle on respective shot areas of a wafer. Furthermore, in this first working configuration, the term "reticle" is used; however, in the present specification, both "reticle" and "mask" are treated as having the same meaning as parts on which a pattern that is to be projected onto the wafer is formed. In FIG. 1, exposing light IL from an illumination system 1 is reflected by a dichroic mirror 2, so that this light illuminates the pattern area on the reticle R. The Z axis is taken parallel to the optical axis of the exposing light IL that has been reflected by the dichroic mirror 2. The X axis is taken in the direction parallel to the plane of the page in FIG. 1 within the two-dimensional plane that is perpendicular to the Z axis, and the Y axis is taken in the direction that is perpendicular to the plane of the page in FIG. 1.

The reticle R is carried on a reticle base 4 via a reticle-side stage 3Y and a reticle-side stage 3X. The reticle-side stage 3X is driven in the X direction with respect to the reticle base 4 via a linear motor (hereafter referred to as the "X-axis linear motor 5") comprising a fixed element 5A and a movable element 5B, and the reticle-side stage 3Y is driven in the Y direction with respect to the reticle-side stage 3X by a linear motor not shown in the figures.

Furthermore, an X-axis movable mirror 6X and a Y-axis movable mirror (not shown in the figures) are fastened to the surface of the reticle-side stage 3Y, and the X-coordinate XR of the reticle-side stage 3X is measured by the movable mirror 6X and an X-axis reticle-side laser interferometer (hereafter referred to as a "reticle interferometer") 7X installed on the outside. The Y-coordinate YR of the reticle-side stage 3Y is measured by a Y-axis movable mirror (not shown in the figures) and a Y-axis reticle interferometer 7Y. The measured X-coordinate XR and Y-coordinate YR are supplied via connectors 17 and 18 to a central control system 8 which performs comprehensive control of the operation of the apparatus as a whole. The stage system comprising the reticle-side stage 3Y, reticle-side stage 3X, reticle base 4, X-axis linear motor 5 and Y-axis linear motor is collectively referred to as the "reticle stage apparatus 3."

Through the intermediary of the exposing light IL, an image of the pattern on the reticle R is reduced via a projection optical system PL, which has a projection magnification of $\beta$, (for example, $\beta$ is ⅕), and is projected and exposed on the respective shot areas of the wafer W. The wafer W is carried on a wafer base 11 via a wafer-side stage 10Y and wafer-side stage 10X. The wafer-side stage 10X is driven in the X direction with respect to the wafer base 11 via a linear motor (hereafter referred to as the "linear motor 12") consisting of a fixed element 12A and movable element 12B, and the wafer-side stage 10Y is driven in the Y direction with respect to the wafer-side stage 10X by a linear motor not shown in the figures.

Furthermore, an X-axis movable mirror 13X and a Y-axis movable mirror (not shown in the figures) are fastened to the surface of the wafer-side stage 10Y, and the X-coordinate X. of the wafer-side stage 10X is measured by the movable mirror 13X and an X-axis wafer-side laser interferometer (hereafter referred to as a "wafer interferometer") 14X installed on the outside. The Y-coordinate YW of the wafer-side stage 10Y is measured by a Y-axis movable mirror (not shown in the figures) and a Y-axis wafer interferometer 14Y. The measured X-coordinate X. and Y-coordinate YW are supplied via connectors 19 and 20 to the central control system 8. The stage system comprising the wafer-side stage 10Y, wafer-side stage 10X, wafer base 11, X-axis linear motor 12, Y-axis linear motor and a Z leveling stage (not shown in the figures) which controls the position of the wafer W in the Z direction and the angle of inclination of the wafer W will be collectively referred to as the "wafer stage apparatus 10."

In the first embodiment of the present invention, three-phase linear motors are used as the linear motors. The linear motor 12 will be described as an example. The linear motor 12 is constructed from a fixed element 12A and a movable element 12B. The fixed element 12A comprises a three-phase armature coil (not shown in the figures), and the movable element 12B consists of four permanent magnets (not shown in the figures) that are fastened to the side surface of the wafer-side stage 10X side by side in the X direction with the polarities of these magnets alternately inverted. Specifically, the linear motor 12 is a moving magnet type linear synchronous motor. Furthermore, it would also be possible. to use a moving coil type linear motor in which the armature coil is accommodated on the side of the movable element.

The central control system 8 positions the reticle R by controlling the operation of the reticle-side X-axis linear motor 5 and Y-axis linear motor via the reticle stage driving system 15, and positions the wafer W by controlling the operation of the wafer-side X-axis linear motor 12 and Y-axis linear motor via the wafer stage driving system 16. As a result of this control, the pattern on the reticle R is reduced and exposed on the respective shot areas of the wafer W.

The reticle stage driving system 15 and wafer stage driving system 16 mount motor driving apparatuses that respectively drive the linear motors 5 and 12. The motor driving apparatuses will be described in detail below.

Figure 2:
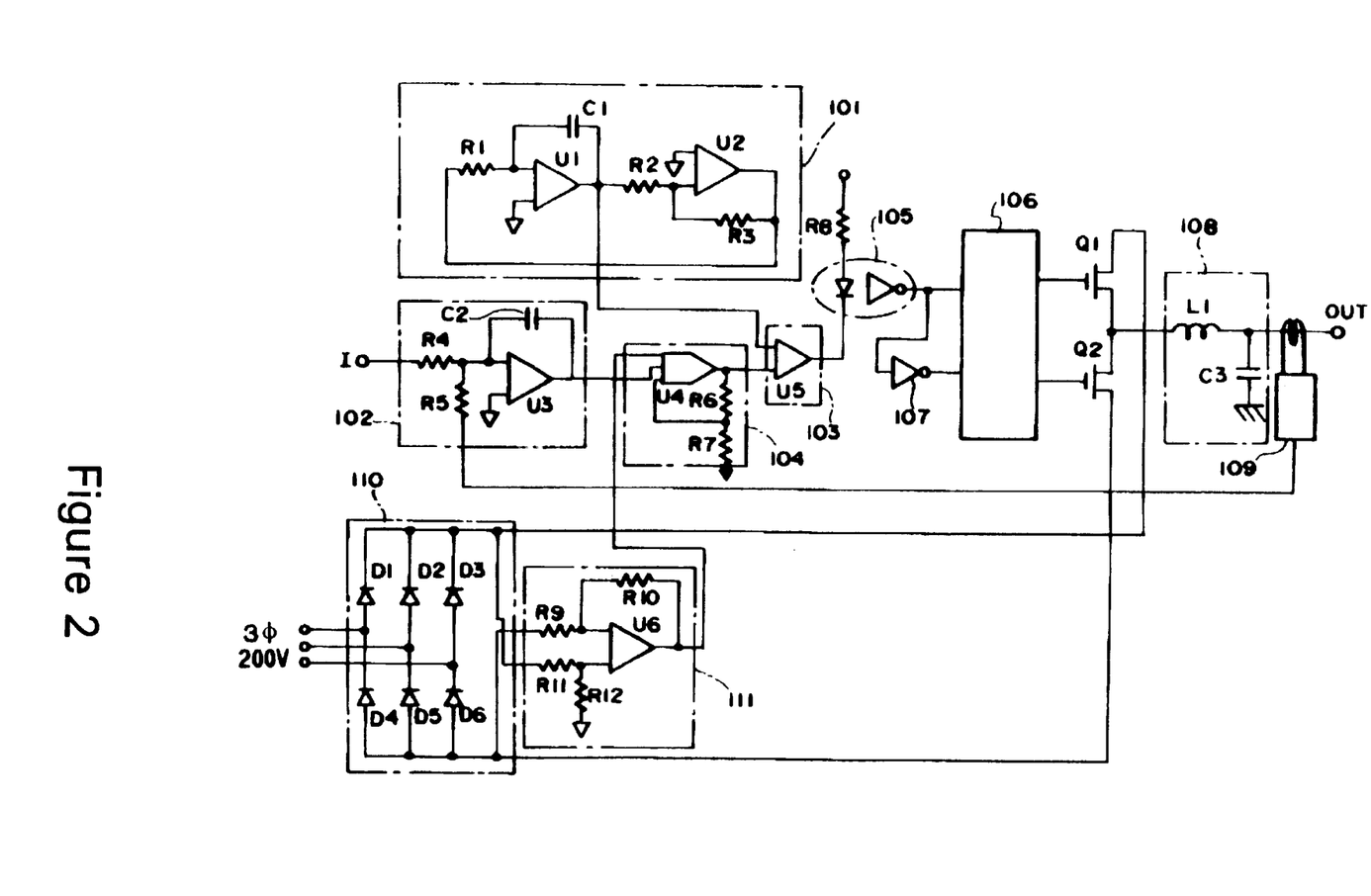
FIG. 2 shows a circuit construction of a motor driving apparatus used to drive a linear motors in a first embodiment of the present invention.

FIG. 2 shows a circuit construction of a motor driving apparatus that drives one of the linear motors of the present invention. Both of the motor driving apparatuses that drive the respective linear motors 5 and 12 are the same in principle; accordingly, one motor driving apparatus that drives one linear motor 5 will be described here as a representative example. The motor driving apparatus shown in FIG. 2 is a current-controlling apparatus (current amplifier circuit) which controls the current that flows to the linear motor 5 in accordance with the voltage level of an input signal (I). In accordance with a specified program, the central control system 8 detects the X-coordinate of the reticle stage 3X by means of a signal from the reticle interferometer 7X, and calculates and outputs a driving signal (input signal I) so that the linear motor 5 is appropriately driven in the X direction.

The motor driving apparatus shown in FIG. 2 uses a PWM (pulse width modulation) system to control the output current in accordance with the voltage level of the input signal I. In FIG. 2, the triangular wave generating circuit 101 comprises resistors R1, R2 and R3, a capacitor C1 and operational amplifiers U1 and U2; this circuit outputs a triangular wave comprising a specified frequency and amplitude. The input signal I is a signal that has the sign ± (plus or minus), and the triangular wave is also a periodic signal that oscillates at the same amplitude plus or minus. As is shown in the figures, the difference detector 102 comprises resistors R4 and R5, a capacitor C2 and an operational amplifier U3. This detector compares the input signal I with the signal from a current sensor 109 (described later), and amplifies and outputs the difference between the two signals. The comparator 103 comprises a comparator U5; this comparator 103 compares the triangular wave from the triangular wave generating circuit 101 with the input signal I input via a dividing circuit 104 (described later), and outputs a PWM·signal (pulse-width-modulated signal). Specifically, a signal formed by pulse-width-modulating the input signal I is output. This pulse width modulation system comprises a well known construction.

The PWM signal that constitutes the output of the comparator 103 is level-shifted by a photo-coupler 105, and is input into a PWM driver 106. In this case, a signal inverted by an inverter 107 is also input into the PWM driver 106. The PWM driver 106 comprises a bridge circuit, and drives the switching of switching FETs Q1 and Q2 on the basis of the PWM signal. The low-pass filter 108 comprises a coil L1 and a capacitor C3; this low-pass filter 108 removes the switching components from the output signals of the switching FETs Q1 and Q2, and produces the desired output signal OUT.

The current component of the output signal OUT from the low-pass filter 108 is detected by the current sensor 109, and is fed back to the above-mentioned difference detector 102. The current sensor 109 comprises a Hall element, and produces a voltage in accordance with the current that flows therethrough. Thus, since the output current is detected and fed back, the motor driving apparatus shown in FIG. 2 acts as an output current control device (current amplifier).

Furthermore, the current sensor 109 could also comprise a resistor and an amplifier circuit instead of a Hall element.

Figure 3:
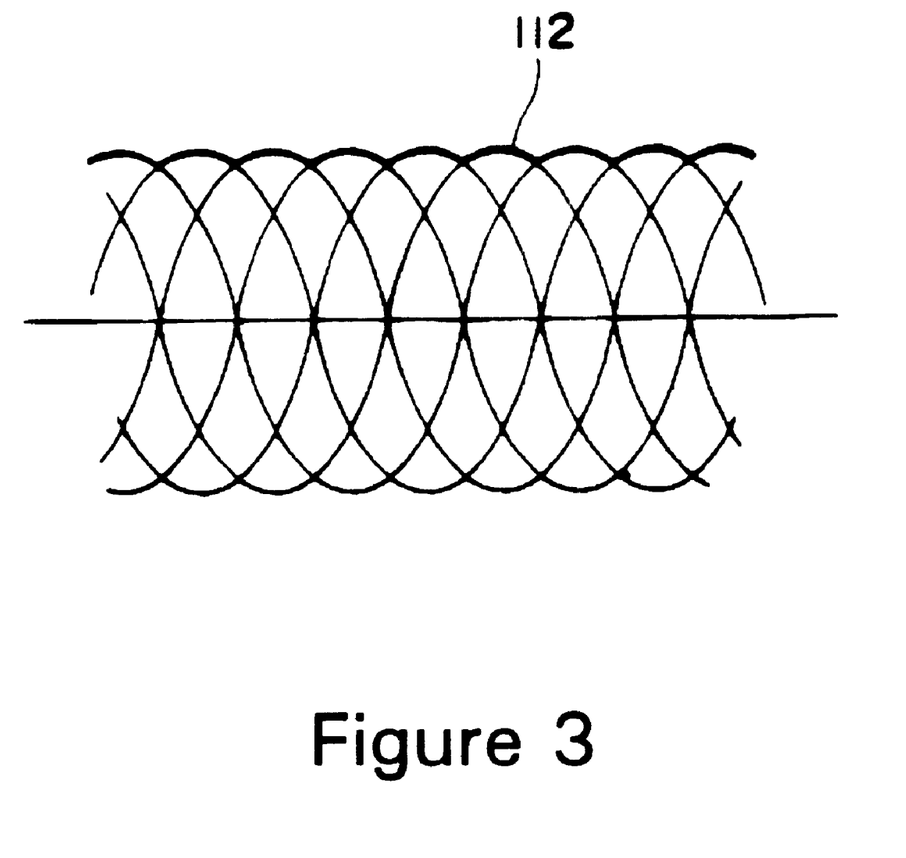
FIG. 3 illustrates conditions of a power supply including a ripple.

The power for the switching FETs Q1 and Q2 is supplied by a power supply circuit 110. The power supply circuit 110 comprises diodes D1 through D6, and supplies. only power obtained by rectifying a three-phase, 200 V alternating-current power supply. Since the power supply circuit 110 supplies only power obtained by rectifying a three-phase, 200 V alternating-current power supply, this results in a power supply 112 which includes a ripple such as that shown in FIG. 3. This ripple is a 300 Hz ripple if the three-phase, 200 V power supply 112 has a frequency of 50 Hz.

If the power supply 112 containing this ripple is used "as is" as the power supply for the switching FETs Q1 and Q2, the output signals of the switching FETs Q1 and Q2 will be signals that have a noise component that is affected by this ripple. Accordingly, in the motor driving apparatus of the present working configuration, a dividing circuit 104 is used in order to eliminate the effect of the ripple component of the power supply 112.

The differential amplifier 111 comprises resistors R9 through R12 and an operational amplifier U6; this amplifier detects the voltage of the power supply 112, amplifies this voltage by a specified coefficient, and inputs the amplified voltage into the dividing circuit 104. The divding circuit 104 comprises a divider U4, and resistors R6 and R7 that determine the coefficient of division; this dividing circuit 104 divides the signal from the difference detection circuit 102 by the signal from the differential amplifier 111, and inputs the result into the comparator 103. Specifically, the input signal I following the feedback of the output current is input into the comparator 103 after being divided by the voltage level of the power supply 112. In concrete terms, the input signal I is corrected to a smaller value in cases where the power supply 112 fluctuates to a large value, and the input signal I is corrected to a larger value in cases where the power supply 112 fluctuates to a small value.

The circuit constants of the dividing circuit 104 and differential amplifier 111 are determined so that in cases where the input signal I has a fixed value, the output signal OUT will show a fixed value that is unaffected by any ripple even if power from a power supply 112 containing a ripple component is supplied to the switching FETs Q1 and Q2.

Furthermore, in the circuit shown in FIG. 2, the input signal I is a voltage signal which has a sign of ± (plus or minus), and in cases where the voltage is ±zero, the duty ratio of the PWM signal is adjusted to a value of 50% so that the output current OUT will be zero. When the input signal I varies in the positive direction, the duty ratio of the PWM signal varies to a value that is smaller than 50%, so that the output current OUT flows in the positive direction in accordance with the magnitude of the input signal I. On the other hand, when the input signal I varies in the negative direction, the duty ratio of the PWM signal varies to a value that is greater than 50%, so that the output current OUT flows in the negative direction in accordance with the magnitude of the input signal I. In the above description, a simple reference to the "magnitude of the input signal I" indicates the magnitude of the absolute value of the input signal I.

Thus, in a circuit using the PWM system (hereafter referred to simply as a "PWM circuit") of the present invention, the output signal OUT (i.e., the output current in the first working configuration) is controlled by varying the duty ratio (degree of modulation) of the PWM signal in accordance with the magnitude of the input signal I. In the PWM circuit of the first embodiment of the present invention, the duty ratio of this PWM signal is adjusted in accordance with fluctuations in the power supply 112. More concretely, in cases where the power supply 112 fluctuates to a large value, the output current OUT becomes larger than the target current; accordingly, the duty ratio of the PWM signal is adjusted so that it approaches 50% in order to reduce the output current OUT. In the first embodiment of the present invention, in order to make this adjustment, a dividing circuit 104 which divides the input signal I by the magnitude of the power supply 112 is inserted. Specifically, in cases where the power supply 112 shows a large fluctuation, the input signal I is controlled to a small value by the dividing circuit 104; as a result, the duty ratio of the PWM signal approaches 50%, so that the output current OUT is adjusted to a smaller value.

Thus, since the output current is adjusted in accordance with fluctuations in the power supply voltage level 112 of the power supply circuit 110, there is no need to install a power supply with a highly precise regulation in the power supply circuit as in conventional devices. The circuit shown in FIG. 2 merely uses a power supply circuit 110 that comprises diodes D1 through D6 that rectify a 3-phase, 200 V power source. As a result, an extreme reduction in the cost of the power supply, reduction in volume and reduction in weight can be realized; furthermore, the high-precision, high-S/N-ratio motor driving that is required in an exposure apparatus, etc., can also be realized. As a result, a reduction in cost, reduction in volume and reduction in weight can be realized while maintaining high-precision, high-S/N-ratio stage driving in the stage apparatus and in an exposure apparatus, etc., using this stage apparatus.

Furthermore, in the above-mentioned embodiment, the relationship between the direction of the variation of the duty ratio in the PWM signal and the direction of the output current OUT may in some cases be reversed depending on the circuit construction.

In a second embodiment of the present invention, another working configuration of the motor driving apparatus shown in FIG. 2 in the first working configuration will be described. The motor driving apparatus of the second working configuration can also be used in the projection exposure apparatus shown in FIG. 1 in the same manner as in the first embodiment. Accordingly, a description of the projection exposure apparatus will be omitted, and the following description will refer to FIG. 1 in regard to the projection exposure apparatus.

Figure 4:
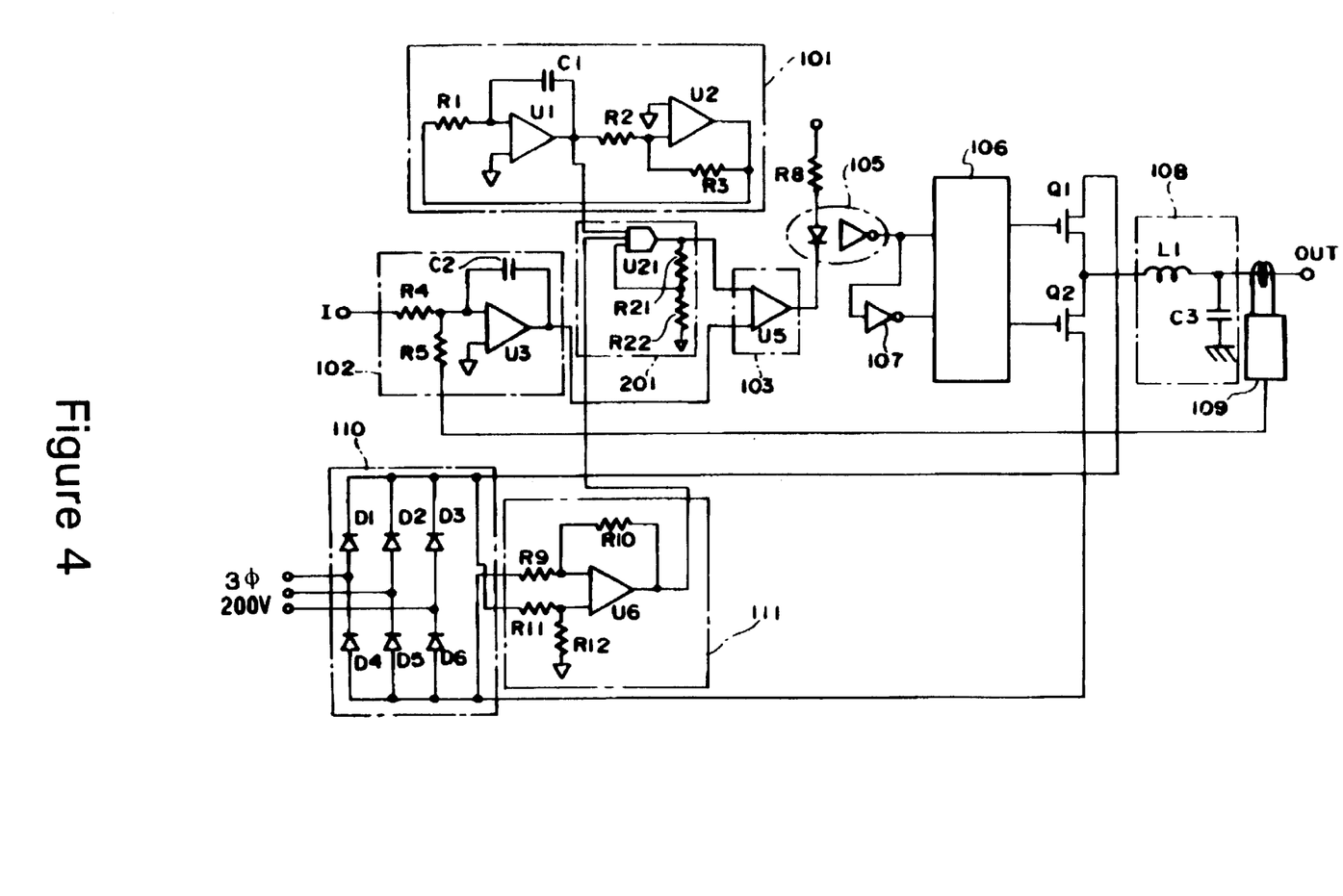
FIG. 4 shows a circuit construction of a motor driving apparatus used to drive linear motors in a second embodiment of the present invention.

FIG. 4 is a diagram which shows the circuit construction of a motor driving apparatus that drives one linear motor. The difference between this motor driving apparatus and the motor driving apparatus shown in FIG. 2 in the first embodiment is that in this motor driving apparatus, the dividing circuit 104 installed on the output side of the difference detection circuit 102 is omitted, and a multiplying circuit 201 is installed on the output side of the triangular wave generating circuit 101 instead. The remaining parts are the same as in the motor driving apparatus shown in FIG. 2; accordingly, the same symbols are assigned to constituent elements that are common to both motor driving apparatuses, and a description of such elements is omitted.

The multiplying circuit 201 comprises a multiplier U21 and resistors R21 and R22 that determine the coefficient of multiplication. The triangular wave from the triangular wave generating circuit 101 is multiplied by the signal from the differential amplifier 111, and the result is input into the comparator 103. More concretely, in cases where the power supply 112 fluctuates to a large value, a correction is made so that the amplitude of the triangular wave increases, and in cases where the power supply 112 fluctuates to a small value, a correction is made so that the amplitude of the triangular wave decreases.

The circuit constants of the multiplying circuit 201 and differential amplifier 111 are determined so that in cases where the input signal I has a fixed value, the output signal OUT will show a fixed value that is unaffected by any ripple even if power from a power supply 112 containing a ripple component is supplied to the switching FETs Q1 and Q2.

As in the first embodiment, the input signal I is a voltage signal which has a sign of ± (plus or minus), and in cases where the voltage is ±zero, the duty ratio of the PWM signal is adjusted to a value of 50% so that the output current OUT will be zero. Since the relationship between the variation in the input signal I and the variation in the duty ratio of the PWM signal is the same as was described in the first working configuration, a description of this relationship will be omitted here.

The PWM circuit in the second embodiment is also a circuit that adjusts the duty ratio of the PWM signal in accordance with fluctuations in the power supply 112. More concretely, in cases where the power supply 112 fluctuates to a large value, the output current OUT becomes larer than the target current; accordingly, the duty ratio of the PWM signal is adjusted so that it approaches 50% in order to reduce the output current OUT. In the second embodiment a multiplying circuit 201 which multiplies the triangular wave signal that is the output of the triangular wave generating circuit 101 by the magnitude of the power supply 112 is inserted in order to make this adjustment.

This utilizes the fact that when the amplitude of the triangular wave increases in cases where the signal levels that are input into the comparator 103 are the same signal levels in the circuit construction shown in FIG. 4, the duty ratio of the PWM signal approaches 50%. Accordingly, in cases where the power supply 112 fluctuates to a large value, the triangular wave is controlled by the multiplying circuit 201 so that this triangular wave has a large amplitude; as a result, the duty ratio of the PWM signal approaches 50% so that the output current OUT is adjusted to a smaller value.

Thus, in the second embodiment as well, the output current is adjusted in accordance with fluctuations in the power supply voltage level 112 of the power supply circuit 110; accordingly, there is no need to install a power supply with a highly precise regulation in the power supply circuit as in conventional devices. As a result, the same effect as that of the first embodiment can be obtained.

In a third embodiment of the present invention, another embodiment of the motor driving apparatus shown in FIG. 2 in the first embodiment will be described. The motor driving apparatus of the third embodiment can also be used in the projection exposure apparatus shown in FIG. 1 in the same manner as in the first embodiment. Accordingly, a description of the profection exposure apparatus will be omitted, and the following description will refer to FIG. 1 in regard to the projection exposure apparatus.

Figure 5:
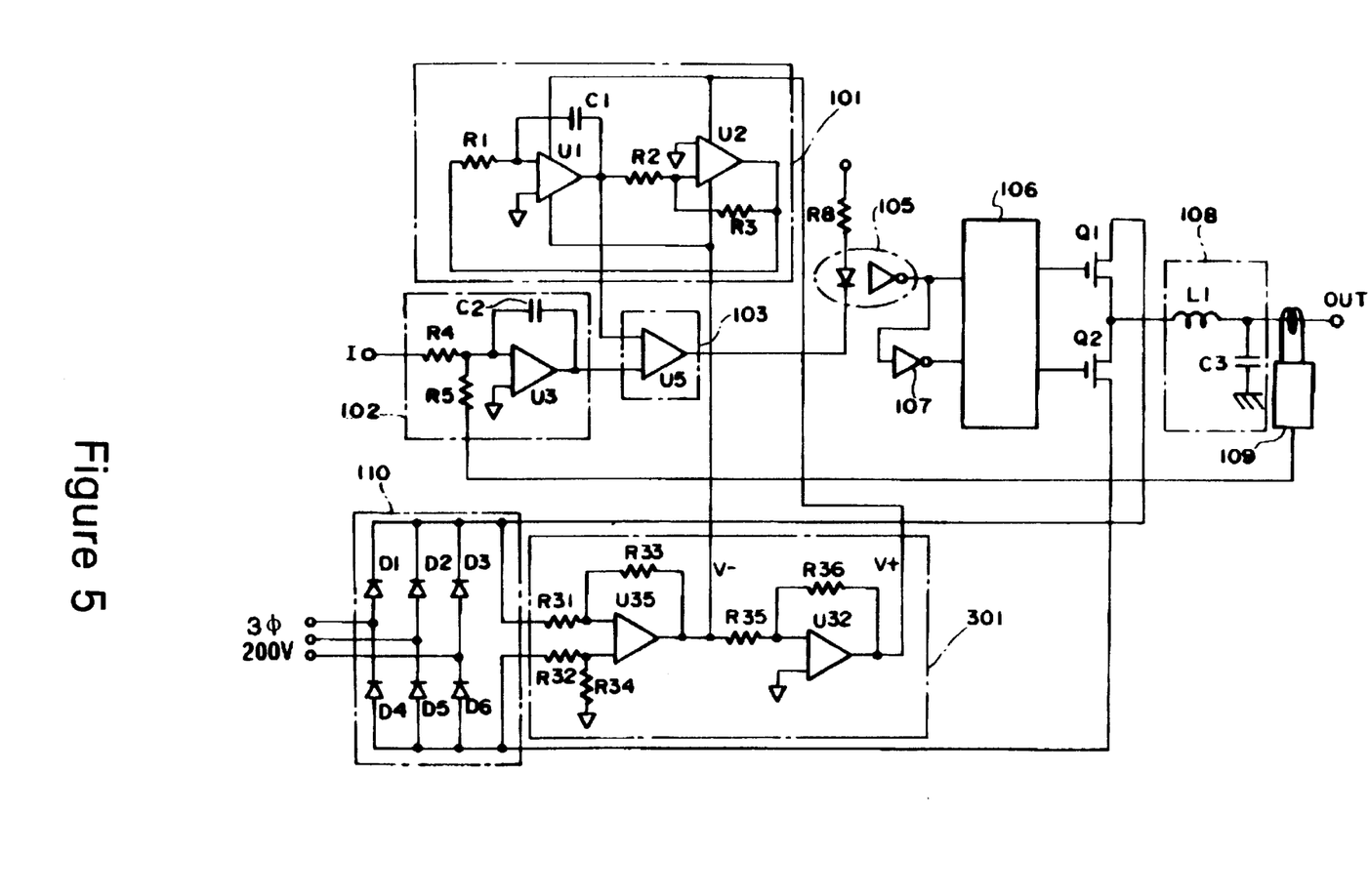
FIG. 5 shows a circuit construction of a motor driving apparatus used to drive linear motors in a third embodiment of the present invention.

FIG. 5 is a diagram which illustrates the circuit construction of a motor driving apparatus that drives one linear motor. The difference between this motor driving apparatus and the motor driving apparatus shown in FIG. 2 in the first embodiment is that in this motor driving apparatus, the dividing circuit 104 installed on the output side of the difference detection circuit 102 is omitted, and a triangular wave power supply circuit 301 that supplies power to the triangular wave generating circuit 101 is installed. The differential amplifier 111 is also removed. The remaining parts are the same as in the motor driving apparatus shown in FIG. 2; accordingly, the same symbols are assigned to constituent elements that are common to both motor driving apparatuses, and a description of such elements is omitted.

The triangular wave power supply circuit 301 comprises a differential amplifier consisting of resistors R31, R32, R33 and R34 and an operational amplifier U35, and an inverted amplifier consisting of resistors R35 and R36 and an operational amplifier U32. A voltage signal "V−" corresponding to the voltage of the power supply 112 is generated by this differential amplifier, and a voltage signal "V+" with the sign inverted is generated by the inverted amplifier. The voltage "V+" and voltage "V−" generated by the triangular wave power supply circuit 301 are supplied as ±power supplies of the operational amplifiers U1 and U2 of the triangular wave generating circuit 101.

The amplitude of the triangular wave generated by the triangular wave generating circuit 101 varies according to the power supply levels supplied to the operational amplifiers U1 and U2. In the third embodiment, this property is utilized to adjust the amplitude of the triangular wave in the same manner as in the second embodiment. More concretely, in cases where the power supply 112 fluctuates to a large value, the potential difference between the voltage "V+" and voltage "V−" generated by the triangular wave power supply circuit 301 is controlled to a large value. As a result, the amplitude of the triangular wave generated by the triangular wave generating circuit 101 is also corrected to a larger value. Similarly, in cases where the power supply 112 fluctuates to a small value, the amplitude of the triangular wave is corrected to a smaller value.

The circuit constants of the triangular wave power supply circuit 301 are determined so to that the voltages "V+" and "V−" are at a voltage level that is suitable as a power supply for the triangular wave generating circuit 101, and so that in cases where the input signal I has a fixed value, the output signal OUT will show a fixed value that is unaffected by any ripple even if power from a power supply 112 containing a ripple component is supplied to the switching FETs Q1 and Q2.

The relationship between the amplitude of the triangular wave and the duty ratio of the PWM signal is the same as was described in the second embodiment; accordingly, a description of this relationship is omitted here.

Thus, in this third embodiment as well, the output current is adjusted in accordance with fluctuations in the power supply voltage level 112 of the power supply circuit 110; accordingly, there is no need to install a power supply with a highly precise regulation in the power supply circuit as in conventional devices. As a result, the same effect as that of the first embodiment can be obtained.

In a fourth embodiment of the present invention, another embodiment of the motor driving apparatus shown in FIG. 2 in the first embodiment will be described. The motor driving apparatus of the fourth embodiment can also be used in the projection exposure apparatus shown in FIG. 1 in the same manner as in the first embodiment. Accordingly, a description of the projection exposure apparatus will be omitted, and the following description will refer to FIG. 1 in regard to the projection exposure apparatus.

Figure 6:
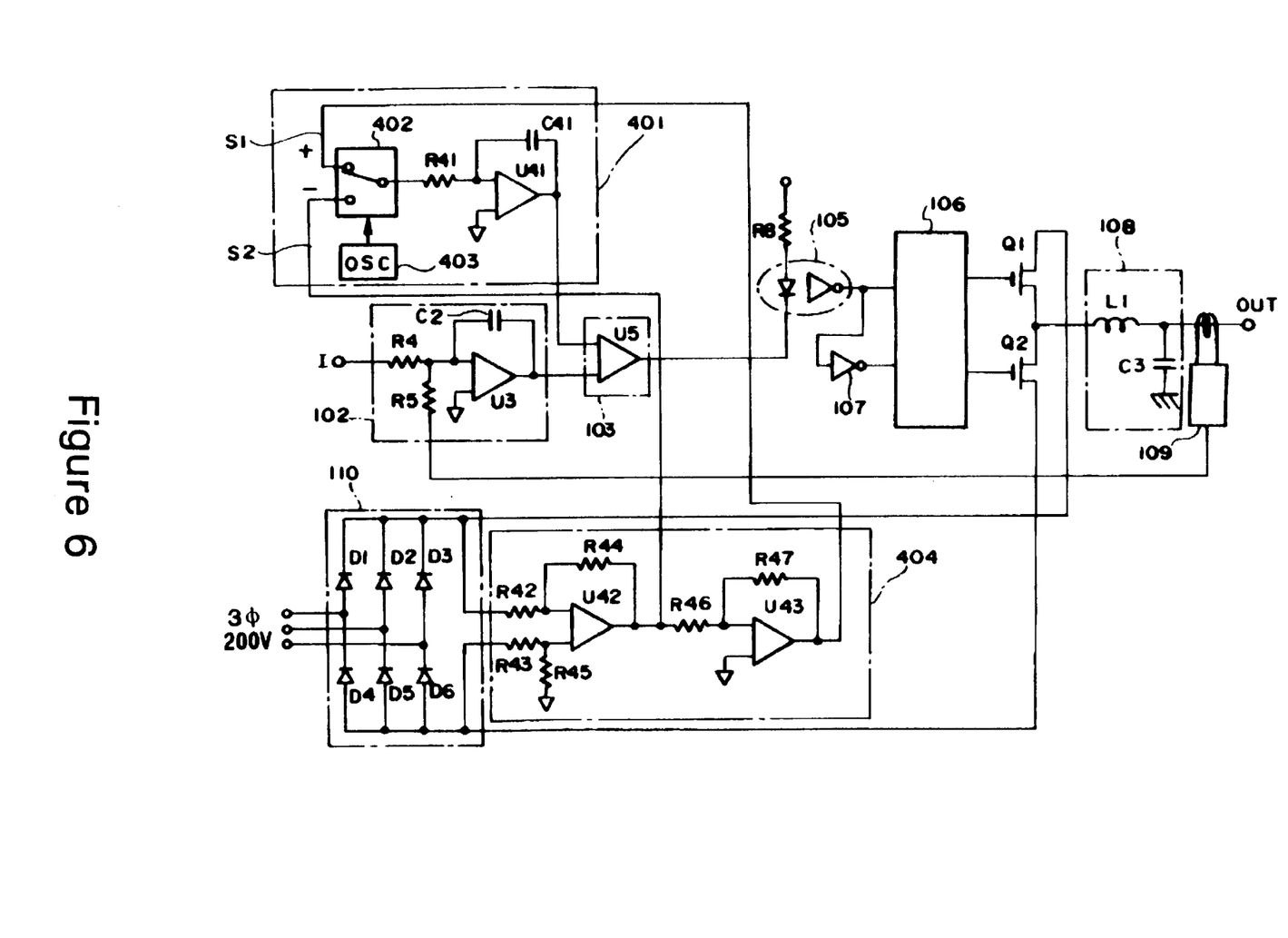
FIG. 6 shows a circuit construction of a motor driving apparatus used to drive linear motors in a fourth embodiment of the present invention.

FIG. 6 is a diagram which illustrates the circuit construction of a motor driving apparatus that drives one linear motor. The difference between this motor driving apparatus and the motor driving apparatus shown in FIG. 2 in the first embodiment is that in this motor driving apparatus, the dividing circuit 104 installed on the output side of the difference detection circuit 102 is omitted, and another triangular wave generating circuit 401 is installed instead of the triangular wave generating circuit 101. Furthermore, the differential amplifier 111 is also removed, and a triangular wave level signal generating circuit 404 which generates ±triangular wave level signals S1 and S2 that vary according to fluctuations in the power supply 112 is installed. The remaining parts are the same as in the motor driving apparatus shown in FIG. 2; accordingly, the same symbols are assigned to constituent elements that are common to both motor driving apparatuses, and a description of such elements is omitted.

The triangular wave generating circuit 401 comprises an oscillator (OSC) 403 which determines the period of the triangular wave, a switching element 402 which receives the signal from the OSC 403 and alternately switches between a "+" triangular wave level signal S1 and a "−" triangular wave level signal S2. and an integrating circuit comprising a resistor R41, a capacitor C41 and an operational amplifier U41, which integrate the output signal from the switching element 402. A triangular wave is output from this integrating circuit and input into the comparator 103. The amplitude of the triangular wave is determined by the voltage levels of the ±triangular wave level signals S1 and S2, the period of the OSC 403, and the values of the resistor R41 and capacitor C41, etc. In the third embodiment, the amplitude of the triangular wave is adjusted by varying the voltage levels of the triangular wave level signals S1 and S2 (among the above-mentioned values). in regard to the adjustment of the amplitude of the triangular wave, this embodiment is the same as the second and third embodiments.

The triangular wave level signals S1 and S2 are generated by the triangular wave level signal generating circuit 404. The triangular wave level signal generating circuit 404 comprises a differential amplifier consisting of resistors R42, R43, R44 and R45 and an operational amplifier U42, and an inverted amplifier consisting of resistors R46 and R47 and an operational amplifier U43. A "−" triangular wave level signal S1 corresponding to the voltage of the power supply 112 is generated by this differential amplifier, and a "+" triangular wave level signal S2 in which the sign of the above-mentioned signal S1 is inverted is generated by the inverted amplifier. The ±triangular wave level signals S1 and S2 generated as triangular wave level signals are input into the switching element 402 of the triangular wave generating circuit 401.

A triangular wave with an amplitude corresponding to fluctuations in the power supply 112 is generated by the triangular wave level signal generating circuit 404 and triangular wave generating circuit 401 constructed as described above. More concretely, in cases where the supply 112 fluctuates to a large value, the potential difference between the ±triangular wave level signals S1 and S2 generated by the triangular wave level signal generating circuit 404 is controlled to a large value. As a result, the amplitude of the triangular wave generated by the triangular wave generating circuit 401 is also corrected to a larger value. Similarly, in cases where the power supply 112 fluctuates to a small value, the amplitude of the triangular wave is corrected to a smaller value.

The respective circuit constants of the triangular wave level signal generating circuit 404 and triangular wave generating circuit 401 are determined so that the amplitude of the triangular wave is controlled to a voltage level that is appropriate for the PWM circuit shown in FIG. 6, to and so that in cases where the input signal I has a fixed value, the output signal OUT will show a fixed value that is unaffected by any ripple even if power from a power supply 112 containing a ripple component is supplied to the switching FETs Q1 and Q2.

The relationship between the amplitude of the triangular wave and the duty ratio of the PWM signal is the same as was described in the second embodiment; accordingly, a description of this relationship is omitted here.

Thus, in this fourth embodiment as well, the output current is adjusted in accordance with fluctuations in the power supply voltage level 112 of the power supply circuit 110; accordingly, there is no need to install a power supply with a highly precise regulation in the power supply circuit as in conventional devices. As a result, the same effect as that of the first embodiment can be obtained.

Furthermore, synchronous linear motors that are driven by applying a three-phase current of mutually different phases are known as linear motors used in the projection exposure apparatus shown in FIG. 1. In the case of such linear motors current amplification by means of a PWM system is applied to the currents of the respective phases. In this case, the power supply circuit 110, the triangular wave level signal generating circuit 404 and the OSC 403 and switching element 402 of the triangular wave generating circuit 401 shown in FIG. 6 may be constructed so that they are shared by the respective phases. Furthermore, within the triangular wave generating circuit 401, it is sufficient if an integrating circuit comprising the resistor R41, capacitor C41 and operational amplifier U41 is installed for each of the circuits used for the respective phases.

Furthermore, even in the case of apparatuses which have a plurality of linear motors and are equipped with a plurality of motor driving apparatuses in order to drive these linear motors, The power supply circuit 110, the triangular wave level signal generating circuit 404 and the OSC 403 and switching element 402 of the triangular wave generating circuit 401 may be constructed so that these parts are shared by the respective linear motor driving apparatuses. By doing this, it is possible to obtain synchronization of the triangular wave among the respective currents that are applied to the motors, so that the generation of noise such as a beat signal, etc., can be prevented.

To say that the PWM amplifier circuit of a motor driving apparatus is affected by the power supply voltage refers to the fact that the PWM amplifier circuit absorbs variations in the output current caused by the power supply voltage by varying the loop gain. As a result, the gain and phase frequency characteristics vary. Accordingly, in the first through fourth embodiments, the voltage of the input signal or the amplitude of the triangular wave (for example) are operationally treated on the basis of the variation in the power supply voltage, so that the loop gain is not affected by fluctuations in the power supply voltage. As a result, a high-precision motor driving apparatus can be realized even in cases where the power supply is more or less unstable or contains a ripple.

In the above-mentioned first through fourth embodiments, examples were described in which the present invention was applied to systems using a rectified 3-phase, 200 V power supply as a power supply; however, the present invention is not necessarily limited to such a power supply. The present invention can be applied in cases using any type of power supply in which sufficient regulation cannot be obtained.

Furthermore, also in regard to the circuit that performs an adjustment according to fluctuations in the power supply, the present invention is not necessarily limited to the above-mentioned embodiments. Any circuit that is capable of adjusting the duty ratio of the PWM signal in accordance with fluctuations in the power supply that supplies power to the switching elements of the PWM circuit may be used. In particular, several concrete examples of circuits that adjust the amplitude of the triangular wave were described; however, it would of course be possible to use any other circuit that adjusts the amplitude of the triangular wave.

In the above embodiments, a PWM current amplifier circuit was indicated; however, the present invention can also be applied to a PWM voltage amplifier circuit.

In the above embodiments, a motor driving apparatus, a stage apparatus utilizing this motor driving apparatus, and an projection exposure apparatus utilizing this stage apparatus, were indicated as examples of application of the PWM circuit of the present invention. However, the present invention is not necessarily limited to such examples of application. The present invention can be applied to any circuit or apparatus that uses a PWM circuit. In such cases, the effect of the present invention is exhibited when the regulation of the power supply supplying power to the switching elements of the PWM circuit is insufficient.

In regard to the exposure apparatus of the present embodiment of the invention. the present invention can also be applied to a scanning type exposure apparatus in which the mask pattern is exposed by synchronously moving the mask and substrate. For example, such a scanning type exposure apparatus is disclosed in U.S. Pat. No. 5,473,410; the present invention can also be applied to such an exposure apparatus.

In regard to the exposure apparatus of the present embodiment, the present invention can·also be applied to a proximity exposure apparatus in which the mask pattern is exposed by causing the mask to adhere tightly to the substrate, without using a projection optical system.

The application of the exposure apparatus is not limited to an exposure apparatus used in semiconductor manufacture. For example, the present invention is also widely suitable for use in liquid crystal exposure apparatuses that expose liquid crystal display element patterns on square glass plates, and exposure apparatuses that are used to manufacture thin-film magnetic heads.

Not only the g line (436 nm), i line (365 nm), KrF excimer lasers (248 nm), ArF excimer lasers (193 nm) and $F_2$ lasers (157 nm), but also charged-particle beams such as X-rays or electron beams, etc., can be used as the light source of the exposure apparatus of the present working configuration. For example, in cases where an electron beam is used, thermo-electron emitting type lanthanum hexaborite ($LaB_6$) or tantalum (Ta) can be used as the electron gun. Furthermore, in cases where an electron beam is used, a construction using a mask may be employed, or a construction in which the pattern is formed on the substrate by direct drawing using an electron beam (without using any mask) may be employed.

In regard to the magnification of the projection optical system, the system used is not limited to a reducing system, but may also be either an equal-magnification system or an enlarging system.

In cases where far ultraviolet light such as light from an excimer laser, etc., is used in the projection optical system, materials that transmit far ultraviolet light such as quartz or fluorite, etc., may be used as glass materials. Furthermore, in cases where an $F_2$ laser or X-rays are used, the optical system may be a reflective-refractive system or refractive system (a reflective type reticle may also be used), and in cases where an electron beam is used, an electron optical system consisting of electron lenses and deflectors may be used as the optical system. Moreover, it goes without saying that the light paths through which the electron beam passes are placed in a vacuum state.

In the case of an exposure apparatus using vacuum ultraviolet light (VUV light) with a wavelength of approximately 200 nm or less, the use of a reflective-refractive type optical system as a projection optical system is also conceivable. For example, as a reflective-refractive type optical system, a reflective-refractive type optical system which has beam splitters and concave mirrors as reflective optical elements (as disclosed in Japanese Patent Application Kokai No. HEI 8-171054 and the corresponding U.S. Pat. No. 5,668,672, as well as in Japanese Patent Application Kokai No. HEI 10-20195 and the corresponding U.S. Pat. No. 5,835,275) may be used. Furthermore, a reflective-refractive type optical system which has concave mirrors, etc., as reflective optical elements (without using beam splitters), as disclosed in Japanese Patent Application Kokai No. HEI 8-334695 and the corresponding U.S. Pat. No. 5,689,377, and in Japanese Patent Application Kokai No. HEI 10-3039 and the corresponding U.S. Pat. No. 5,873.605, etc., may also be used. The present invention can also be applied to exposure apparatuses equipped with such projection optical systems.

In addition, a reflective-refractive type optical system in which a plurality of refractive optical elements and two mirrors (a main mirror consisting of a concave mirror, and an auxiliary mirror consisting of a backed mirror which has an incident surface formed by a reflective element or parallel flat plate and which has a reflective surface formed on the opposite side) are disposed on the same optical axis, and an intermediate image of the reticle pattern formed by the plurality of refractive optical elements is re-focused on the wafer by the main mirror and auxiliary mirror, as disclosed in U.S. Pat. Nos. 5,031,976, 5,488,229 and 5,717,518, may also be used. In this reflective-refractive type optical system, the main mirror and auxiliary mirror are disposed after the plurality of refractive optical elements, and the illuminating light reaches the surface of the wafer via a portion of the main mirror.

Furthermore, a reducing system which has a circular image field, in which the object plane side and image plane side are both telecentric, and in which the projection magnification is ¼× or ⅕×, may also be used as a reflective-refractive type projection optical system. In the case of a scanning type exposure apparatus equipped with this reflective-refractive type projection optical system, this apparatus may be of the type in which the illumination area of the illuminating light is substantially centered on the optical axis of the projection optical system within the visual field of the projection optical system. and is restricted to a rectangular slit form that extends in a direction substantially perpendicular to the scanning direction of the reticle or wafer. In the case of such a scanning type exposure apparatus. for example, a fine pattern of approximately 100 nmL/S can be transferred onto the wafer with high precision even if $F_2$ laser light with a wavelength of 157 nm is used as the illuminating light for exposure. The present invention can also be applied to an exposure apparatus equipped with such a projection optical system.

The linear motors used for the wafer stage or reticle stage may be either air-floating type to motors using air bearings, or magnetic-floating type motors using Lorentz force or reactance force. Moreover, the stages may be of a type that moves along guides, or of a guideless type that has no guides.

In cases where planar motors are used in the stage driving apparatus, either the magnet units or the armature units may be connected to the stage, and the other of these units (magnet units or armature units) may be connected to the side of the moving surface of the stage. Furthermore, motors with the construction disclosed in Japanese Patent Application Kokai No. HEI 11-27925 may be used as planar motors.

Furthermore, the reaction force generated by the movement of the wafer stage may be allowed to escape to the floor (ground) mechanically by using frame members as described in (for example) Japanese Patent Application Kokai No. HEI 8-166475. The present invention may also be applied to wafer stages equipped with such a reaction force treatment method.

The reaction force generated by the movement of the reticle stage may be allowed to escape to the floor (ground) mechanically by using frame members as described in (for example) Japanese Patent Application Kokai No. HEI 8-330224. The present invention may also be applied to reticle stages equipped with such a reaction force treatment method.

The exposure apparatus in the above embodiments of the present invention can be manufactured by assembling various types of subsystems containing the respective constituent elements described herein so that the specified mechanical precision, electrical precision and optical precision are maintained. In order to guarantee these respective types of precision, adjustments for the purpose of achieving optical precision are performed for the various types of optical systems, adjustments for the purpose of achieving mechanical precision are performed for the various types of mechanical systems, and adjustments for the purpose of achieving electrical precision are performed for the various types of electrical systems, before and after the above-mentioned assembly. The process of the assembly of the various subsystems into the exposure apparatus includes the mechanical connection of the various subsystems to each other, the wiring connection of the electrical circuits and the piping connection of the air pressure circuits, etc. It goes without saying that the assembly of the individual subsystems is performed prior to the assembly of these various subsystems into the exposure apparatus. After the assembly of the various subsystems into the exposure apparatus has been completed, a comprehensive adjustment process including electrical adjustment and checking of operations, etc., is performed, so that the various types of precision of the exposure apparatus as a whole are guaranteed. Furthermore, it is desirable that the manufacture of the exposure apparatus be performed in a clean room in which the temperature and degree of cleanness, etc., are controlled.

Figure 7:
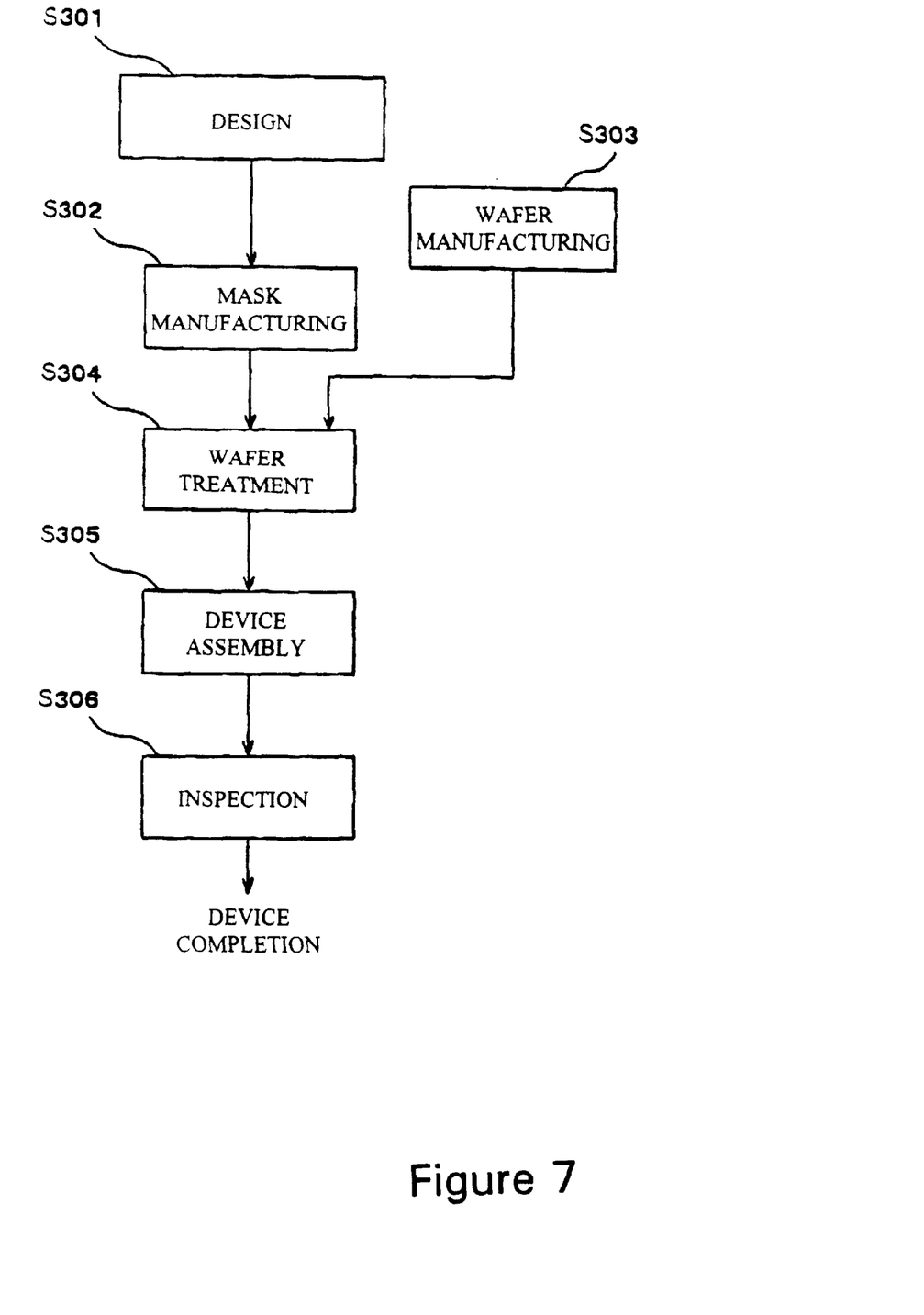
FIG. 7 shows a flow chart illustrating a semiconductor manufacturing process of the present invention.

As is shown in FIG. 7, the semiconductor device of the present invention is manufactured via a step S301 in which the functions and performance of the device are designed, a step S302 in which a mask (reticle) is manufactured on the basis of this design step, a step S303 in which a wafer is manufactured from a silicon material, a wafer treatment step S304 in which the pattern of the reticle is exposed on the wafer by means of the exposure apparatus of the above-mentioned working configuration, a device assembly step S305 (including a dicing process, bonding process and packaging process), and an inspection step S306, etc.

Below, this device manufacturing method will be described in even greater detail. FIG. 7 shows a flow chart which illustrates one example of the manufacture of a device (e.g., a semiconductor chip such as an IC of LSI, etc., liquid crystal panel, CCD, thin-film magnetic head or micromachine, etc.). As is shown in FIG. 7, the design of the functions and performance of the device (e.g., circuit design of a semiconductor device, etc.) are first performed in step S301 (design step). Here, pattern design is performed in order to realize the above-mentioned functions. Next, in step S302 (mask manufacturing step), a mask (reticle) on which the designed circuit pattern is formed is manufactured. Meanwhile, in step S303 (wafer manufacturing step), a wafer is manufactured using a material such as silicon, etc.

Next, in step S304 (wafer treatment step), an actual circuit, etc., is formed on the wafer by a lithographic technique, etc. (as will be described later), using the mask (reticle) and wafer prepared in steps S301 through S303. Next, in step S305 (device assembly step), the device is assembled using the wafer treated in step S304. Processes such as a dicing process, bonding process and packaging process (chip sealing), etc., are included in this step S305 as necessary.

Finally, in step S306 (inspection step), an inspection including a operation checking test and durability test, etc., of the device manufactured in step S305 is performed. Following the completion of these processes, the device is completed, and this device is shipped.

Figure 8:
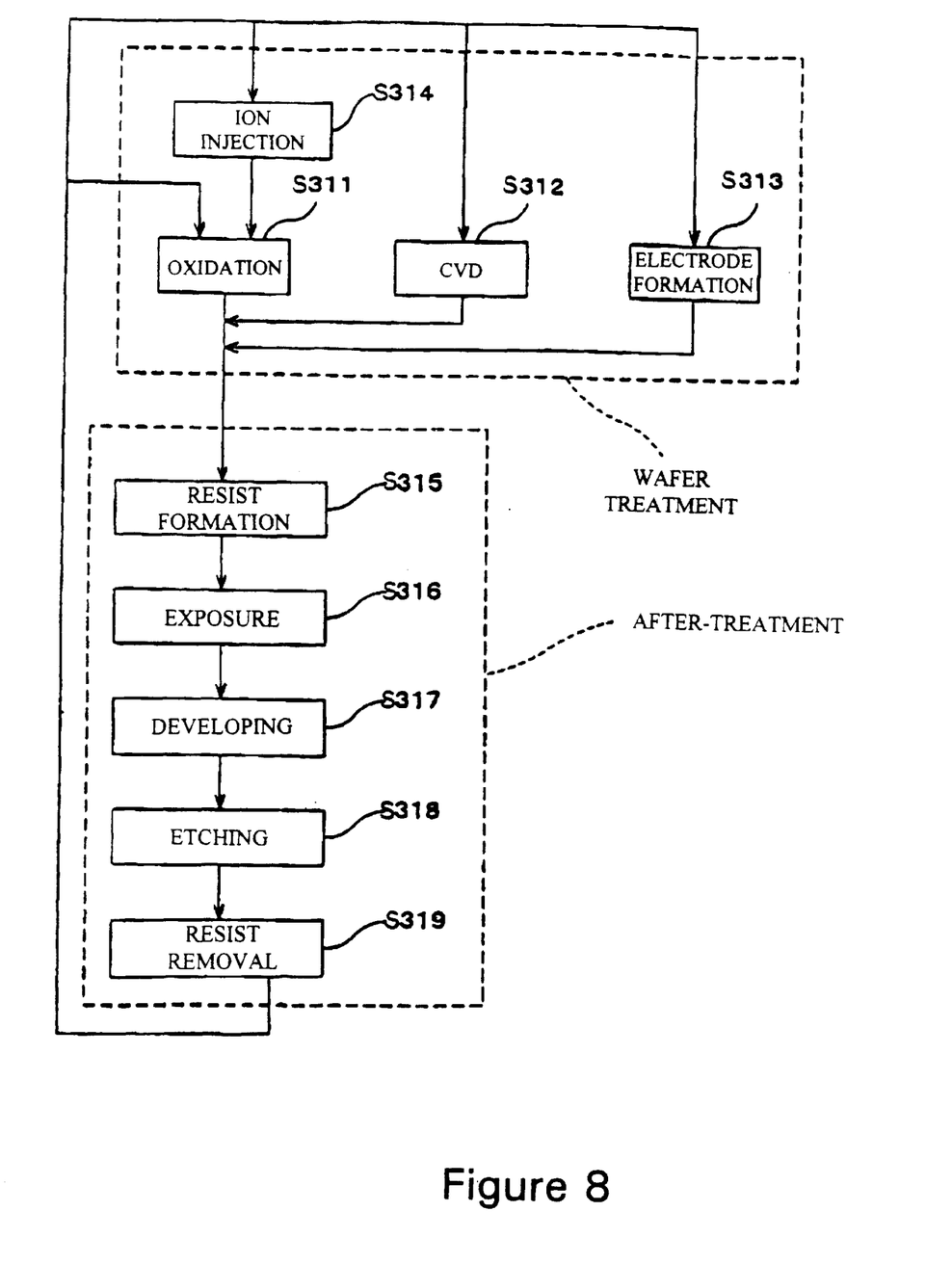
FIG. 8 shows a detailed flow chart of step S304 in FIG. 7.

FIG. 8 shows one example of the detailed flow of the above-mentioned step S304 in the case of a semiconductor device. In FIG. 8, the surface of the wafer is oxidized in step S311 (oxidation step). An insulating film is formed on the surface of the wafer in step S312 (CVD step). Electrodes are formed on the wafer by vacuum deposition in step S3 13 (electrode formation step). Ions are injected into the wafer in step S314 (ion injection step). The above steps S311 through S314 constitute the pretreatment process for respective stages of the wafer treatment. In each stage, the necessary treatments are selected and performed.

When the above-mentioned pretreatment process is completed in each stage of the wafer process, an after-treatment process is performed as shown below. In this after-treatment process, the wafer is first coated with a photosensitive agent in step S315 (resist formation step). Next, in step S316 (exposure step), the circuit pattern of the mask (reticle) is transferred onto the wafer using the exposure apparatus of the present working configuration. Next, in step S317 (developing step), the exposed wafer is developed, and in step S318 (etching step), the surface of the exposed member in areas other than the areas where the resist remains is removed by etching. Then, in step S319 (resist removal step), the resist that is unnecessary following the completion of etching is removed.

Circuit patterns are formed in multiple layers on the wafer by repeating the mention-pretreatment and after-treatment.

As a result of being constructed as described above, the present invention possesses the following merits.

Since the duty ratio of the PWM signal is adjusted in accordance with fluctuations in the power supply level supplied to the PWM control apparatus, there is no need to install a power supply with a highly precise regulation in the power supply circuit. For example, a power supply in which a three-phase alternating current is merely rectified by means of diodes is sufficient. Accordingly, an extremely great reduction in the cost of the power supply, reduction in the volume of the power supply and reduction in the weight of the power supply can be achieved. Furthermore, the use of a high-precision, high-S/N-ratio PWM control apparatus becomes possible. For example, a reduction in cost, reduction in volume and reduction in weight can be achieved while maintaining high-precision, high-S/N-ratio control in a motor driving apparatus used to drive motors, a stage apparatus utilizing this motor driving apparatus, and an exposure apparatus utilizing this stage apparatus, etc.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A pulse-width-modulated (PMW) control apparatus comprising:

a triangular wave generating circuit which generates a triangular wave;

a comparator for comparing an input signal and the triangular wave and outputting a PWM signal with a pulse width corresponding to a voltage level of the input signal;

switching elements which are connected to a power supply for switching a voltage of the power supply on and off and output a voltage based upon of the PWM signal; and an adjustment circuit for adjusting a duty ratio of the PWM signal according to fluctuations in the voltage of the power supply.

2. The PWM control apparatus of claim 1, wherein the adjustment circuit comprises a circuit for dividing the voltage of the input signal by the voltage of the power supply.

3. The PWM control apparatus of claim 1, wherein the adjustment circuit adjusts an amplitude of the triangular wave in accordance with fluctuations in the voltage of the power supply.

4. The PWM control apparatus of claim 3, wherein the adjustment circuit multiplies a triangular wave output from the triangular wave generating circuit by the voltage of the power supply.

5. The PWM control apparatus of claim 3, wherein the adjustment circuit adjusts a voltage of a triangular wave generating circuit power supply that supplies power to the triangular wave generating circuit in proportion to fluctuations of the voltage of the power supply.

6. The PWM control apparatus of claim 3, wherein the triangular wave generating circuit comprises:

switching circuits for alternately switching between two different signal levels at specified frequencies; and, integrating circuits for integrating outputs of the switching circuits and outputting a triangular wave, wherein the adjustment circuit comprises an amplifier circuit that outputs the two different signal levels, and wherein a signal level difference of the two different signal levels varies in proportion to fluctuations of the voltage of the power supply.

7. A PWM control apparatus comprising:

a triangular wave generating circuit for generating a triangular wave;

a comparator for comparing an input signal and the triangular wave and outputting a PWM signal with a pulse width corresponding to a voltage level of the input signal;

switching elements connected to a power supply for switching a voltage from the power supply on and off and outputting a voltage based upon the PWM signal; and, an adjustment circuit for adjusting the voltage level of the input signal input to the comparator according to a variation of the voltage of the power supply.

8. PWM control apparatus comprising:

a triangular wave generating circuit for generating a triangular wave;

a comparator for comparing an input signal and the triangular wave and outputting a PWM signal with a pulse width corresponding to a voltage level of the input signal;

switching elements connected to a power supply for switching a voltage from the power supply on and off and outputting a voltage based upon the PWM signal; and, an adjustment circuit for adjusting an amplitude of the triangular wave according to a variation of the voltage of the power supply.

9. A motor driving apparatus comprising:

a motor driving circuit having a current amplifier circuit, wherein the current amplifier circuit comprises the PWM control apparatus claimed in any one of claims 1 through 8.

10. A stage apparatus comprising:

a stage that carries an object of movement;

a motor that drives the stage to move the object of movement; and, the motor driving apparatus claimed in claim 9 which drives the motor.

11. An exposure apparatus which forms a specified pattern on a substrate by means of exposure, the exposure apparatus comprising at least the stage apparatus of claim 10, which carries and moves one of either a mask or the substrate.

12. A device manufactured by the exposure apparatus of claim 11.

13. A device manufacturing method comprising the exposure apparatus of claim 11 and a process in which the exposure is performed by the exposure apparatus.

14. A pulse-width-modulator (PWM) control method comprising:

a voltage from a power supply switched on and off and output on a basis of a PWM signal having a pulse width that corresponds to a voltage level of an input signal, wherein a duty ratio of the PWM signal is adjusted based upon fluctuations in a voltage level of the power supply.

* * * * *